US008813355B2

(12) United States Patent
Brunner

(10) Patent No.: US 8,813,355 B2
(45) Date of Patent: Aug. 26, 2014

(54) METHOD FOR PRODUCING A CURRENT METERING DEVICE

(75) Inventor: Markus Brunner, Bessenbach (DE)

(73) Assignee: Vacuumschmelze GmbH & Co. KG, Hanau (DE)

(*) Notice: Subject to any disclaimer, the term of this patent is extended or adjusted under 35 U.S.C. 154(b) by 567 days.

(21) Appl. No.: 12/986,709

(22) Filed: Jan. 7, 2011

(65) Prior Publication Data

US 2012/0013331 A1 Jan. 19, 2012

(30) Foreign Application Priority Data

Jan. 8, 2010 (DE) ........................ 10 2010 004 223

(51) Int. Cl.
*G01R 3/00* (2006.01)

(52) U.S. Cl.
USPC ................. 29/861; 29/593; 336/192; 336/65; 336/83; 336/198; 336/232; 324/76.11; 324/244; 324/126; 324/127; 324/200

(58) Field of Classification Search
USPC ........ 29/595, 592.1, 593, 831, 861, 829, 825; 324/76.11, 244, 126, 127, 200; 336/192, 65, 83, 198, 229, 107, 200, 336/232, 233
See application file for complete search history.

(56) References Cited

U.S. PATENT DOCUMENTS

| | | | | |
|---|---|---|---|---|
| 3,657,651 | A * | 4/1972 | Road et al. | 324/137 |
| 4,887,028 | A | 12/1989 | Voisine et al. | |
| 5,343,143 | A | 8/1994 | Voisine et al. | |
| 7,142,084 | B2 * | 11/2006 | Cheng | 336/200 |
| 7,692,526 | B2 * | 4/2010 | Hundt | 336/192 |
| 2006/0001517 | A1 | 1/2006 | Cheng | |
| 2010/0090678 | A1 | 4/2010 | Brunner et al. | |

FOREIGN PATENT DOCUMENTS

| | | | |
|---|---|---|---|
| DE | 222058 | | 5/1910 |
| DE | 1782776 | | 2/1959 |
| DE | 1925553 | A1 | 11/1970 |
| DE | 3232704 | C2 | 3/1986 |
| DE | 10 2004 058 452 | A1 | 6/2006 |
| EP | 0 343 274 | A1 | 11/1989 |
| EP | 0 627 630 | A2 | 12/1994 |
| EP | 1 114 429 | | 7/2001 |
| EP | 1 129 459 | | 9/2001 |
| EP | 1 131 830 | | 9/2001 |
| EP | 1 467 214 | A2 | 10/2004 |
| FR | 2030487 | A5 | 11/1970 |

(Continued)

OTHER PUBLICATIONS

European Search Report dated Apr. 19, 2011 for European Patent Application No. 10197415.2-1524.

(Continued)

*Primary Examiner* — Peter DungBa Vo
*Assistant Examiner* — Azm Parvez
(74) *Attorney, Agent, or Firm* — Dickinson Wright PLLC

(57) ABSTRACT

A method for producing a current metering device with current conductor optionally made of aluminum or aluminum alloy, which has a middle section in the form of a bar and two end sections with flattened areas, and is bent between one end section at a time and the middle section, a magnetic module which has a bushing which holds the current conductor, and two copper or copper alloy sleeves which are applied at least to parts of the end sections of the current conductor.

16 Claims, 5 Drawing Sheets

(56) References Cited

FOREIGN PATENT DOCUMENTS

| | | |
|---|---|---|
| WO | WO 00/17897 | 3/2000 |
| WO | WO 00/30131 | 5/2000 |
| WO | WO 00/30132 | 5/2000 |

OTHER PUBLICATIONS

Office Action dated Dec. 12, 2012, issued in Corresponding German Application No. 102010004223.4.

* cited by examiner

METHOD FOR PRODUCING A CURRENT METERING DEVICE

BACKGROUND

1. Field

Disclosed herein is a method for producing a current metering device which can be used for example in electricity meters or power meters.

2. Description of Related Art

For current metering or power metering, various electronic electricity meters are known which are increasingly replacing mechanical Ferraris meters in industry and the household and which meter current with arrangements of different mechanical and electrical structure. In addition to current metering with measurement shunts, Rogowski coils or Hall elements, current transformers based on soft magnetic annular cores, especially annular band cores, as magnetic modules, are common in electricity meters, A magnetic module (current transformer, transformer) causes electricity mains isolation and delivers a precise measurement quantity in the form of a signal voltage to a load resistor, The demands for amplitude accuracy, phase accuracy, and linearity are established by IEC 62053, −21, −23 or previously 1036 in Europe and ANSI C12.xx in the USA and can be found for example in the company brochure “VAC-current transformers for electronic power meters”, of Vacuumschmelze, October 1998, Embodiments of current transformers for electronic power meters are generally also known from the company brochure “Current transformers for electronic power meters” of Vacuumschmelze 2002, Power meters using these current transformers (also called watthour meters) are used as officially approved measurement means to bill the electrical current which represents the power consumption and which is used by a consumer for the utility.

A structure of busbars which form so-called primary conductors and an annular core current transformer which matches them for metering of current consumption is conventional, Plug-in electricity meters which are common in the USA and other countries have standardized rectangular terminal lugs on the back which are pushed into slots with suitable spring contacts when the electricity meter is mounted, These terminals with a cross section of roughly a×2.5 mm are used for feed and discharge of the current consumed which is a maximum of roughly 200-480 $A_{eff}$ in 110 V systems. The width a of the cross section is for example a=19 mm at a maximum current of Imax=320$A_{eff}$. Conventionally the currents of the three phases of the AC network are routed into the electricity meter, through a current metering system and again out of the electricity meter.

The current transformer can be made such that a busbar measuring for example 19×2.5 mm can be inserted through an inner hole of the current transformer. The region of the busbar on which the current transformer is to be located can also have a round cross section so that the inner hole of the current transformer can be made smaller and accordingly a smaller and more economical annular band core can be used. Even if the production time of the core and the winding time are otherwise the same, the consumption of high quality magnet material and the process steps of heat treatment and coating are more favorable when the diameter of the core is smaller. A busbar suitable for this purpose is produced by making available a U-shaped conductor arrangement with different sections, A central connecting section with a round cross section is used as an element of the current conductor for routing through the corresponding opening in the current transformer. Two terminal conductor sections with a rectangular cross section are used to connect the current conductor in the form of the conventional plug-and-socket connections explained above.

When the current transformer is mounted on a one-piece primary conductor, at this point it is critical to slip the inductive transformer on the primary conductor together with its terminal contacts. Thus the minimum inside diameter of the magnetic transformer is necessarily determined by the size of the plug-in contact in a primary conductor produced from one piece.

If the primary conductor is made of several individual parts, it is possible to adapt the inside diameter of the inductive current transformer to the minimum which is possible from the electromagnetic design, however increased cost in the assembly of the primary busbar must then be tolerated. The conductor arrangement consists of three metal parts with differing cross sections, and the two ends of the round current conductor can be attached to the flattened surfaces of the rectangular terminal conductors. Conventional joining methods in producing busbars are brazing and welding methods, In both methods it is critical to protect the current transformer from the heat which arises in the joining process, for which complex structures with cooling tongs between the joining site and current transformer are necessary.

Another disadvantage of this method is the very limited possibilities of process monitoring of the joining method. Reliable monitoring of the connecting site is essentially only possible by destructive testing. To circumvent these disadvantages of thermal joining methods, for example DE 10 2004 058 452 has proposed carrying out the joining process in the form of cold pressure welding. In this method the action of heat during the joining process is avoided, but the resulting connections of the individual parts of the primary conductor have other defects. Thus only a fraction of the connecting surface consists of cold pressure welded material. Most of the connecting surface is connected only positively with the result that an air gap in the micron range remains between the joining partners. This gap reduces the current carrying capacity of the connecting point with the result of possibly unduly high heating of the joining site when the conductor is loaded with the maximum current.

The connections of this conductor arrangement of three elements with cross sections which differ from one another at the connection points should enable a long service life of for example roughly 10-15 years with high reliability so that production of the conductor arrangement must be done in a very process-reliable manner. For reasons of electrical conductivity the corresponding busbars or conductor arrangements are made primarily of copper material. But problems arise both in brazing and also welding, especially due to the heating in the preparation of the connecting points since the heat is transferred through the current conductor to the current transformer and can damage it.

SUMMARY

There remains a need for a method for producing a current metering device which makes available simple and economical production with reliable connection and loading of other components which is as small as possible.

This need is met by embodiments of a method for producing a current metering device as described herein.

Disclosed herein is method as claimed for producing a current metering device having a current conductor which has a middle section and two end sections, wherein the middle section has the shape of a bar and the two end sections each have flattened areas, and having a magnetic module for measurement of a current flowing in the current conductor via the magnetic field produced by it, the method comprising:

providing a magnetic module, a current conductor and two copper sleeves, wherein the current conductor has a middle section in the shape of a bar and has two end sections, and is made of, e.g., aluminum or aluminum alloy or other conductive, non-copper material, and wherein the sleeves fit onto at least parts of the end sections of the current conductor and are made of copper or copper alloy;

applying one sleeve to at least one part of one end section of the current conductor;

applying the other sleeve to at least one part of the other end section of the current conductor;

positioning the current conductor and the magnetic module relative to one another such that the middle section of the current conductor is located with respect to the magnetic module such that the magnetic module meters the magnetic field which forms when current is flowing through the current conductor, bending the current conductor between the middle section and one end section, bending the current conductor between the middle section and the other end section, flattening the current conductor on one end section provided with one sleeve, and flattening the current conductor on the other end section provided with the other sleeve, wherein the sequence of the applying, bending, flattening and positioning steps is optional, provided that each applying of a sleeve takes place prior to the respective flattening of the end section to which the sleeve has been applied.

BRIEF DESCRIPTION OF DRAWINGS

Exemplary embodiments are shown in the figures described below:

FIG. 5 is a schematic diagram that shows another sample embodiment of the current metering device with the current conductor pushed through;

DETAILED DESCRIPTION OF SPECIFIC EMBODIMENTS

The method and the current metering device as described herein uses as the current conductor 1 a one-piece aluminum or aluminum alloy body which on its ends is provided with copper or copper alloy sleeves 5 which can optionally be coated at least on their outer surfaces with tin or a tin alloy layer. For final shaping of the resulting copper contact surfaces cold pressing can be used. Thus, expensive copper as the conductor material is quantitatively minimized, but the size of the current metering means is still kept as small as possible and no decrease in performance is found compared to an arrangement consisting of solid copper with respect to the reliability of the current conductor (e.g. primary conductor).

This is achieved by limiting the use of copper to the regions of the primary current conductor where the properties which can be achieved with this material, such as for example very good contact resistance and minimum contact resistance as well as essentially negligible creep tendency, are necessary. In the region of the contact bars of the primary conductor these material properties are essential. In all other regions of the primary conductor, only relatively low electrical resistance of the conductor is necessary which can be achieved with corresponding adaptation of the conductor cross section even with materials which have higher specific resistances than copper. The advantage of the method described herein is also that the reliability and optimum current carrying capacity of a body of the primary conductor produced from one part is accompanied by minimization of the size of the magnetic module as a result of optimum use of the conductor or bushing cross section.

Figure 1:
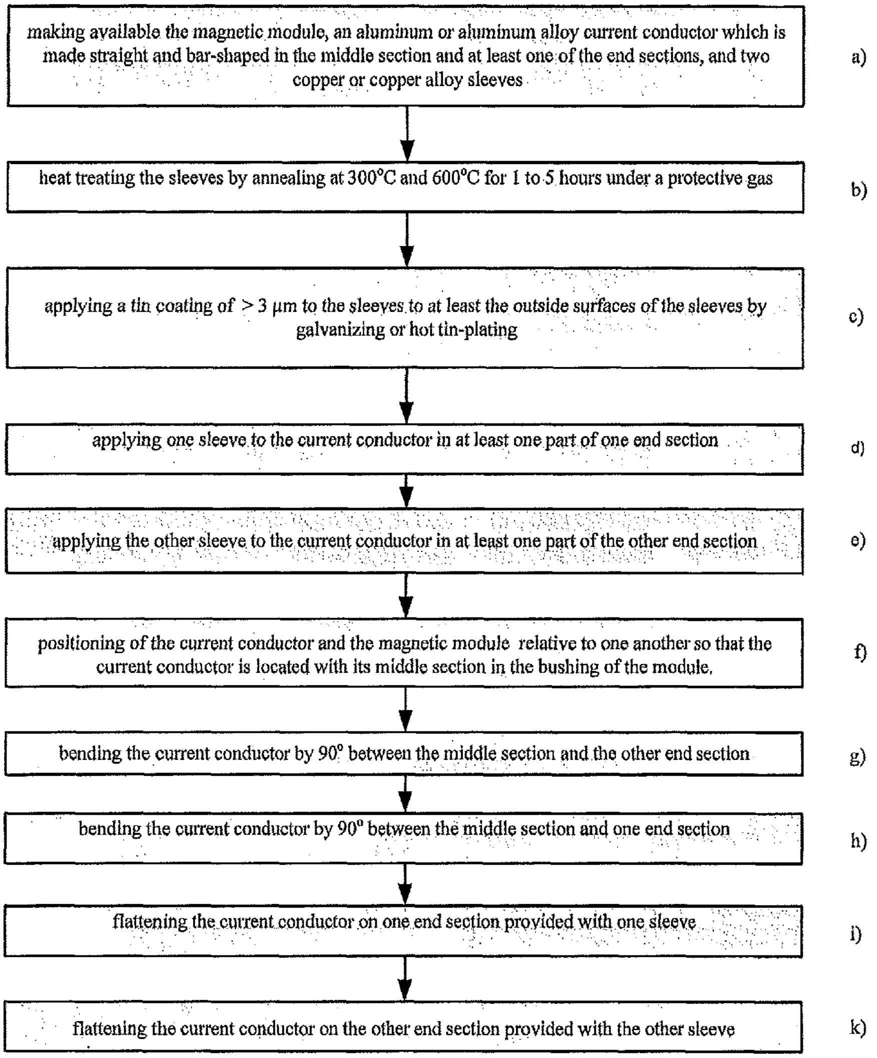
FIG. 1 is a flow diagram that shows the progression of a first example of a production process disclosed herein.

FIG. 1 shows a sample progression of a first production method as disclosed herein. The final product of this production method is a current metering device, such as a current transformer, a current sensor or the like. This final product is shown in FIG. 4F, The current metering device shown there comprises a one-piece conductor 1 of a certain length, bent into a u-shape, which has a middle section and two end sections. In the middle section, the conductor has the shape of a bar with a nonrectangular conductor cross section and in its end sections has flattened regions (in the area of the sleeves 5) with a rectangular conductor cross section. In addition, there is a magnetic module 2 which is located in the middle section of the conductor 1 (also called the primary conductor, according to its function) and which has a bushing 3 which holds the conductor 1. This module, as shown, can consist of at least a wound annular core and in addition under certain circumstances can also comprise electronics, such as a semiconductor circuit.

One embodiment of the production method presented here is shown in FIG. 1. In method step a) first the magnetic module and a current conductor which is made straight and bar-shaped in its middle section and at least one of the end sections, and which consists here of pure aluminum, but could also consist of an aluminum alloy or other suitable material, aside from copper or copper alloy, and two copper or copper alloy sleeves which fit onto at least parts of the end sections of the current conductor are provided.

In method step b) heat treatment is done in which the sleeves are annealed, for example at a temperature of 300° C. to 600° C. over 1 to 5 hours under a protective gas.

Figure 4:
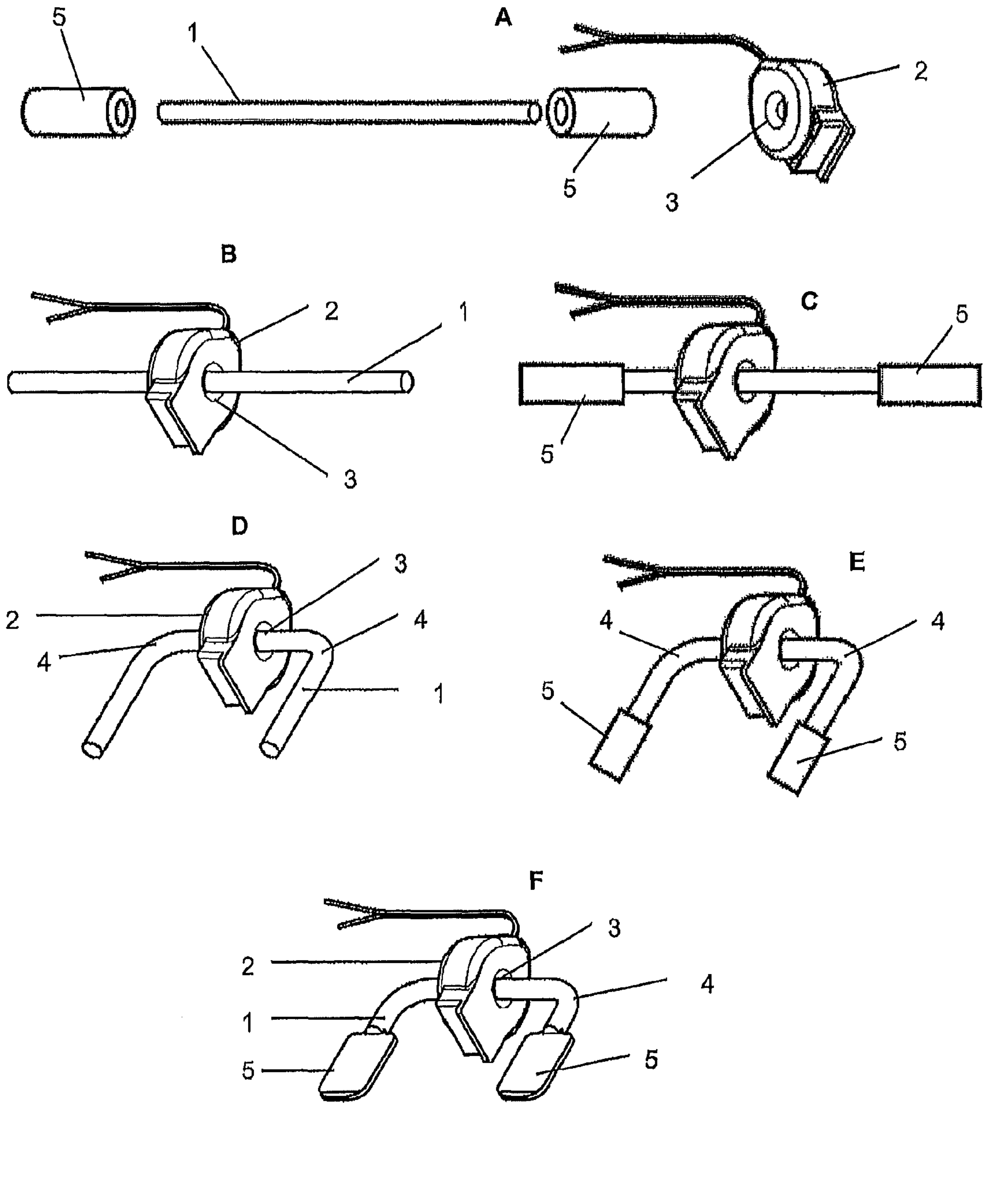
FIG. 4 A-F are schematic diagrams that show different intermediate products obtained in production, including a completely mounted current metering device (final product)

In method step c) a tin coating of at least 3 μm is applied to at least the outside surfaces of the sleeves by galvanizing or hot tin-plating. This leads to initial products A as shown in FIG. 4. In this embodiment it is assumed that the current conductor is made available as a continuously straight, bar-shaped current conductor with a round cross section, as shown in the figure.

In method step d) one of the sleeves is applied to the current conductor in at least one part of one end section of the current conductor.

In method step e) the other sleeve is applied to the current conductor in at least one part of the other end section of the current conductor.

In method step f) the current conductor and the magnetic module are positioned relative to one another for example by pushing into one another, such that the current conductor is located with its middle section in the bushing of the module. This step leads to an intermediate product C as shown in FIG. 4.

In method step g) the current conductor is bent, for example, to an angle of 90° between the middle section and one end section.

In method step h) the current conductor is bent, for example, to an angle of 90° between the middle section and the other end section. There is thus an intermediate product E as shown in FIG. 4, in which at two points 4 between the middle section and the two end sections bending by 90° occurs, yielding a u-shaped conductor. But other shapes would also be possible in the same way, if this is desired or necessary.

In method step i) the current conductor is flattened on one end section provided with one sleeve.

In method step k) the current conductor is flattened on the other end section provided with the other sleeve. This results in the final product F as shown in FIG. 4.

The deformation carried out in steps i) and k) can take place for example by cold working (for example cold pressing). The sequence of the steps of the method can also be altered such that steps d) and e) take place only after step f) (see intermediate product B as shown in FIG. 4) or after steps g) and h) (see intermediate product D as shown in FIG. 4). Moreover the sequence of steps of the method can be altered such that the steps i) and k) directly follow the steps d) and e).

Figure 2:
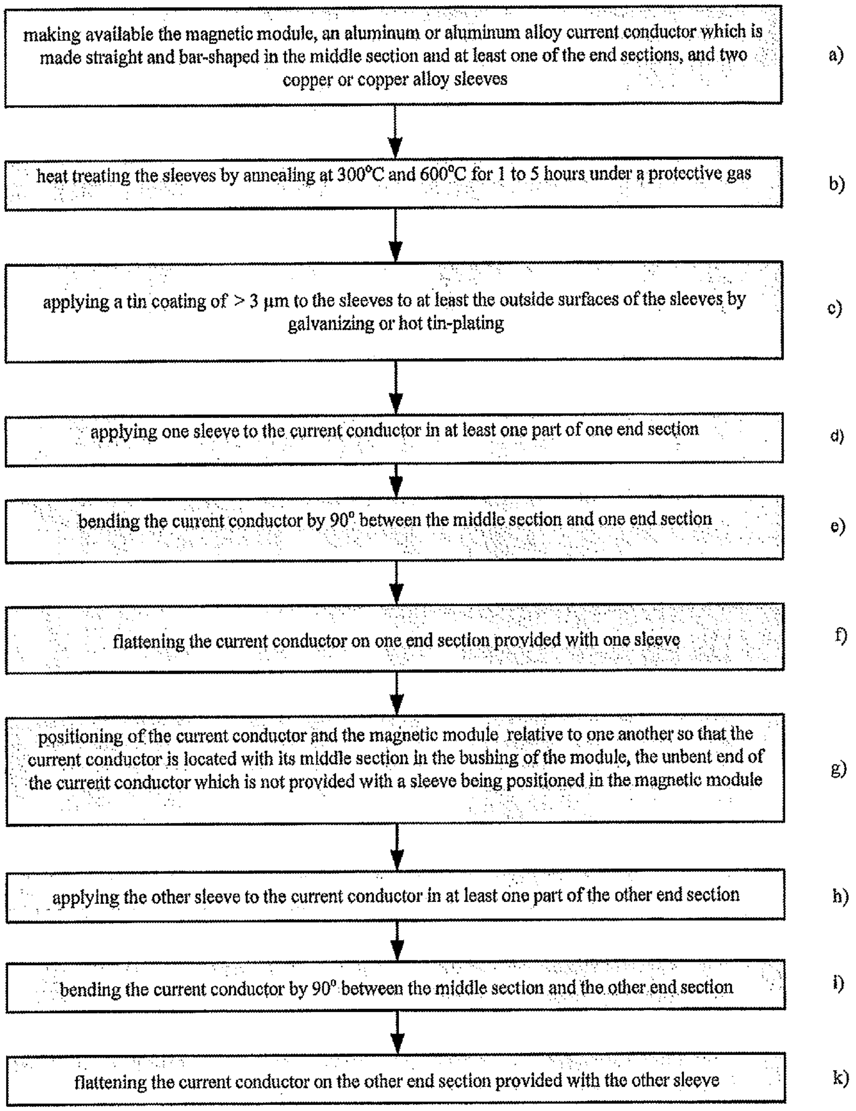
FIG. 2 is a flow diagram that shows the progression of a second example of a production process disclosed herein.

FIG. 2 shows the progression of another embodiment of a production method as described herein. Here, in method step a) in turn the magnetic module and a current conductor which is made straight and bar-shaped in its middle section and at least one of the end sections, and two sleeves which fit onto at least parts of the end sections of the current conductor, are provided.

In method step b) heat treatment is done in which the sleeves are annealed, for example at a temperature of 300° C. to 600° C. over 1 to 5 hours under a protective gas.

In method step c) a tin coating of at least 3 microns is applied to at least the outside surfaces of the sleeves by galvanizing or hot tin-plating. Accordingly there are initial products as shown in FIG. 4A. In this example it is assumed that the current conductor is made available as a continuously straight, bar-shaped current conductor with a round cross section.

In method step d) one of the sleeves is applied to the current conductor in at least one part of one end section of the current conductor.

In method step e) the current conductor is bent to an angle of 90° between the middle section and one end section, In method step f) the current conductor is flattened on one end section provided with one sleeve.

In method step g) the current conductor and the magnetic module are positioned relative to one another such that the current conductor is located with its middle section in the bushing of the module, for positioning purposes the unbent end section without a sleeve being routed through the magnetic module.

In method step h) the other sleeve is applied to the current conductor in at least one part of the other end section of the current conductor.

In method step i) the current conductor is bent to an angle of roughly 90° between the middle section and one end section, In method step k) the current conductor is flattened on the other end section provided with the other sleeve. This results in the final product as shown in FIG. 4F, The sequence of the steps of the method can also be altered such that step d) takes place after step e) and before step f) and/or the step h) takes place after step i) and before step k) and/or that steps d), e) and f) take place after step g).

Figure 3:
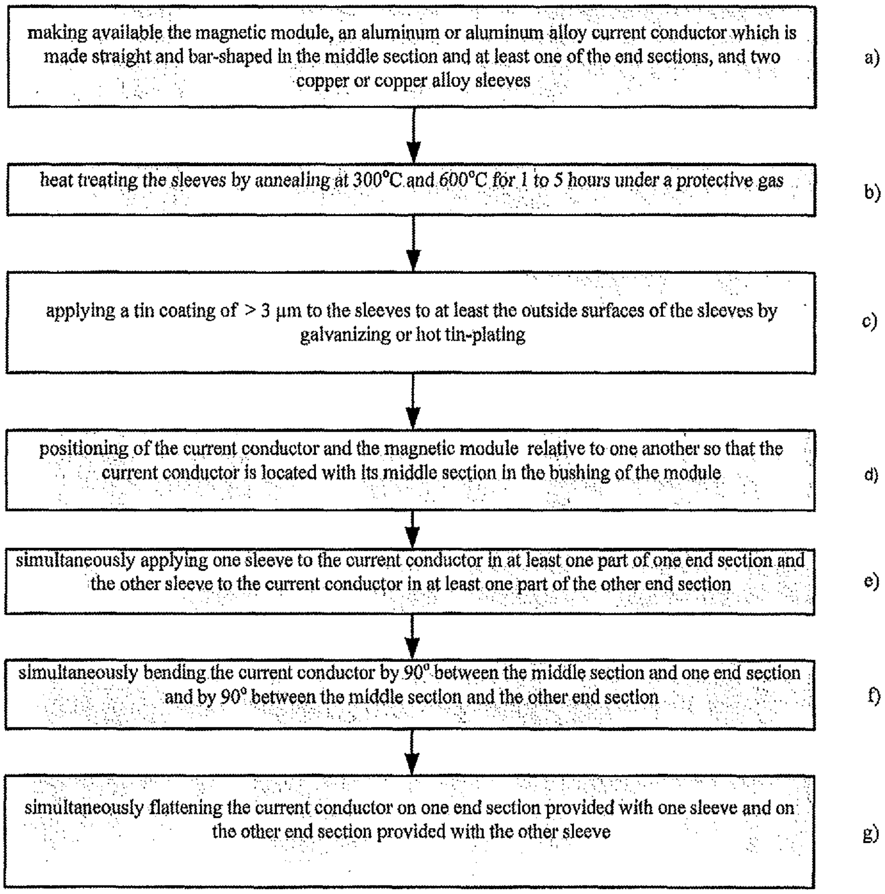
FIG. 3 is a flow diagram that shows the progression of a third example of a production process disclosed herein.

FIG. 3 shows another example of a production method as claimed in the invention. Here in method step a) in turn the magnetic module and a current conductor which is made straight and bar-shaped in its middle section and at least one of the end sections, and two sleeves which fit onto at least parts of the end sections of the current conductor, are provided, In method step b) heat treatment is done in which the sleeves are annealed for example at a temperature of 300° C. to 600° C. over 1 to 5 hours under a protective gas.

In method step c) a tin coating of at least 3 μm is applied to at least the outside surfaces of the sleeves by galvanizing or hot tin-plating. Accordingly there are initial products as shown in FIG. 4A.

In method step d) the current conductor and the magnetic module are positioned relative to one another such that the current conductor is located with its middle section in the bushing of the module. After method step d) there is an intermediate product as shown in FIG. 4B.

In method step e) simultaneous application of one sleeve to the current conductor in at least one part of one end section and of the other sleeve to the current conductor in at least one part of the other end section takes place.

In method step f) simultaneous bending of the current conductor to an angle of roughly 90° between the middle section and one end section and to an angle of roughly 90° between the middle section and the other end section takes place.

In method step g) simultaneous flattening of the current conductor on one end section provided with one sleeve and on the other end section provided with the other sleeve takes place. This results in a final product as shown in FIG. 4F, The sequence of the steps of the method can also be altered such that step f) takes place before step e), as a result of which after step f) there is an intermediate product as shown in FIG. 4D.

Figure 5:
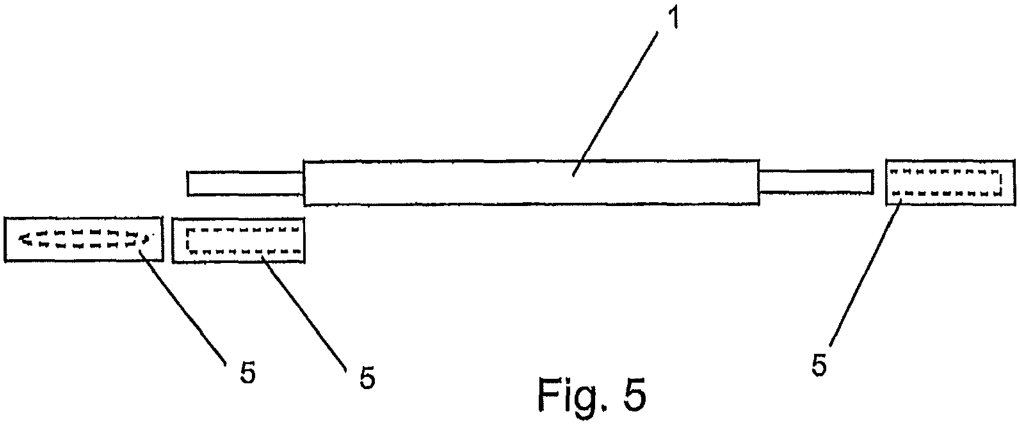

FIG. 5 shows another sample embodiment of a current conductor of the current metering device. Here the end sections of the current conductor 1, which hold the sleeves 5, are made with a smaller diameter such that the diameter of the arrangement of the current conductor 1 and the applied sleeves 5 (which are likewise made with a smaller diameter opening), in the region of the end sections of the current conductor 1 is not larger than in the middle section of the current conductor 1.

In this way the bushing 3 of the magnetic module 2 which holds the current conductor 1 (see FIG. 4) can also be made with the smallest possible diameter, e.g., if before positioning of the current conductor 1 and of the magnetic module 2 relative to one another, one or both of the sleeves 5 are applied to the current conductor 1. The current carrying capacity of the current metering means can be determined by the choice of the size of the diameter in the middle section of the current conductor 1 and thus the outside diameter of the sleeves 5.

In the above explained exemplary embodiments it is therefore provided that a current conductor 1 (primary conductor) is made available with any, for example circular, cross section and with a circumference which is the minimum possible at a given cross section. When pure aluminum or an aluminum alloy is used as the conductor material of the body, heat treatment of the current conductor 1 can be completely omitted. Moreover pure aluminum or aluminum alloys are very economical for this use, Furthermore, in a more particular embodiment, for each terminal end of the primary conductor a sleeve is made available whose inside diameter at a maximum 0.5 mm larger than the outside diameter of the corresponding terminal end and having a length that corresponds at least to the length of the region to be worked later. The wall thickness of the sleeve here is at least 0.3 mm, the closed end of the sleeve has a minimum thickness of 2 mm. This sleeve is subjected to annealing between roughly 300 and 600° C. for roughly one to five hours in a neutral protective gas as heat treatment to establish the structure necessary for subsequent working. The sleeve prepared in this way is then provided with a tin coating at least on the outer surfaces having a minimum thickness of greater than 3 μm. The coating can be provided either galvanically or thermally.

Here it can be established that tin coatings of at least this thickness during shaping of the terminal surfaces of the primary conductor by cold pressing constitute an extremely effective lubricant. This minimizes the deformation work necessary for working of the primary conductor, improves contour precision of the parts and enables use of smaller and thus more economical deformation pressing. It was moreover established that this tin coating after working is preserved as a closed coating free of faults. As a result, the coating on the finished primary conductor ensures the necessary corrosion protection and good electrical contact-making capacity of the terminal surfaces.

These two properties are important prerequisites for producing the current transformer device described here. If it were not possible to provide the tin coating of the copper sleeves which form the later terminal surfaces of the primary conductor before actual shaping, the coating necessary for reliable and permanent contact-making would have to be applied subsequently either galvanically or by hot tin-plating.

In the case of subsequent galvanic tin plating there would be the problem that the current transformer already located on the primary conductor would have to be protected against the entire galvanic process chemistry in a very expensive manner. If tin plating were carried out as hot tin plating on the mounted current transformer module, the problem of thermal loading of the current transformer would arise again, which would require comparably complex measures with cooling tongs as in the production of the primary conductor from several individual parts described above. Furthermore it would also be essentially impossible to maintain the required narrow mechanical tolerances of the contact surfaces by a hot tin plating process in a process-reliable manner.

In the mounting of the current conductor, the two ends of the conductor are bent at a right angle according to the distance of the contact surfaces according to the ANSI standard. The correspondingly prepared primary conductor is then inserted into the pressing tool and the two terminal contact surfaces of the primary conductor are shaped out of the ends of the primary conductor either individually (for example in succession) or jointly (at the same time) by cold flow pressing.

Since copper or copper alloys have a much higher yield limit than aluminum or aluminum alloys, it is precluded that, the sleeve which has been pushed over the aluminum conductor bar will tear during working. Rather a contact element is formed whose aluminum core is surrounded by a copper jacket which at the conventional diameter ratios of this application has roughly half the wall thickness of the original sleeve. In the region of the transition between the inner aluminum conductor and the outer copper jacket, cold welding occurs to some extent, but a flat positive connection always occurs so that optimum electrical contact-making of the aluminum conductor with the copper jacket acting as a terminal surface is ensured.

Furthermore, according to this method the outer contact surfaces of the sleeve after working are strain-hardened to high quality and furthermore coated superficially with a closed tin layer, which results on the one hand in very good corrosion protection and on the other hand enables optimum electrical contact-making of the current conductor with the building-side electrical installation.

This simplified production method presupposes that the conductor cross section of the contact surfaces of the ANSI Standard (2.38×19 mm) is given by the sum of the cross sections of the undeformed conductor and mounted sleeve.

A primary conductor for a current carrying capacity of roughly 200 $A_{eff}$ which is conventional in a 110 V system can be produced for example by using a bar-shaped conductor of pure aluminum with a diameter of 7 mm, over whose two ends tin-plated copper sleeves with an outside diameter of 7.7 mm, an inside diameter of 7.1 mm, a sleeve length of 35 mm with a sleeve closed end thickness of 2 mm are pushed.

If there is a requirement for a thicker, and thus of course mechanically also much more stable, copper jacket, for example a primary conductor bar of aluminum with a diameter of 7 mm can be used whose two ends are tapered to a diameter of 5.6 mm over a length of 35 mm. Tin-plated copper sleeves with an outside diameter of 8.0 mm, an inside diameter of 6.0 mm, and sleeve length of 35 mm with a sleeve bottom thickness of 2 mm are pushed over the bar ends.

In the same way, cross sectional adaptation of the primary conductor which becomes necessary for an optionally desired higher current carrying capacity can be done. If, for example, for the current carrying capacity of roughly 320 $A_{eff}$ (which is likewise conventional in a 110 V system) a current conductor is required, it can be easily produced from a round bar of pure aluminum with a diameter of 9.7 mm whose two ends are tapered to a diameter of 5.6 mm over a length of 35 mm. Here likewise tin-plated copper sleeves with an outside diameter of 8.0 mm, an inside diameter of 6.0 mm, a sleeve length of 33 mm and a sleeve closed end thickness of 2 mm are pushed over the bar ends.

Regardless of the above described diameter variations, after mounting of the tin-plated copper sleeves the contact surfaces are shaped by cold working. In this method step a positive and at least in part adhesive connection of the aluminum conductor to the mounted tin-plated copper sleeves occurs. Thus the current transformer module is ready to install for producing a electronic power meter.

An electronic circuit in the electricity meter meters the current and computes from the current intensity (and optionally the phase angle) the energy consumed, as is described for example in U.S. Pat. No. 4,887,028.

Economical production of a magnetic module for high quality current transformers comprises use of annular cores, especially annular band cores (e.g., unslotted with a winding or slotted with a Hall element), and winding of the insulated or encapsulated cores with the corresponding secondary winding based on copper enamelled wire, Cores suitable for this purpose are known for example from EP 1 131 830 and EP 1 129 459, EP 1 114 429 describes current transformers for these purposes.

Figure 6:
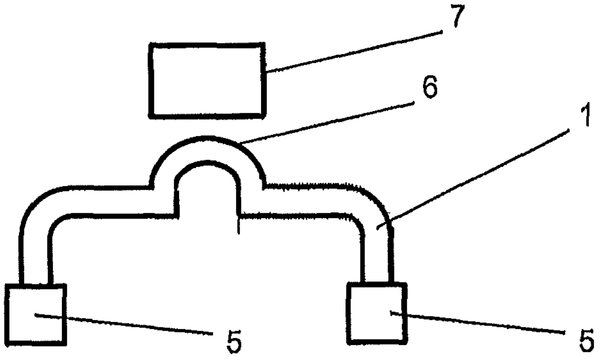
FIG. 6 is a schematic diagram that shows a sample embodiment of the current metering device with the current conductor attached.

It is also possible to use other current measuring modules, such as so-called Rogowski coils or Hall IC-based systems with the described current conductor, Here the conductor either as in magnetic annular core current transformers leads through an opening in the measurement module, or as shown in FIG. 6, for example, the measurement module 1 is located in a specially shaped loop 6 of the current conductor 1 such as is advantageous in using modules 7 with Rogowski coils or Hall elements. The one-piece current conductor 1 which leads either through the module or past it in the immediate vicinity is common to all designs.

The entire contents of all publications and patents referenced in this specification are incorporated by reference.

The invention having been described herein with respect to certain of its specific embodiments and examples, it will be understood that these do not limit the scope of the appended claims.

The invention claimed is:

1. A method for producing a current metering device comprising:

a current conductor comprising a middle section having a shape of a bar and two end sections comprising flattened areas, and a magnetic module for measurement of a current flowing in the current conductor via a magnetic field produced by it, comprising a bushing having one or more diameters, the method comprising:

providing a magnetic module, the current conductor comprising a middle section having a shape of a bar and two end sections, and two sleeves containing copper or a copper alloy and that fit onto at least parts of the end sections of the current conductor;

applying one sleeve to at least one part of one end section of the current conductor;

applying the other sleeve to at least one part of the other section of the current conductor;

positioning the current conductor and the magnetic module relative to one another such that the middle section of the current conductor is located with respect to the magnetic module such that the magnetic module meters the magnetic field which forms when current is flowing through the current conductor;

bending the current conductor between the middle section and one end section, bending the current conductor between the middle section and the other end section, flattening the current conductor on one end section provided with one sleeve, and flattening the current conductor on the other end section provided with the other sleeve, wherein the flattening comprises producing a rectangular conductor cross section, and wherein at least one flattening is such that the longer edge length of the rectangular cross section on the ends of the current conductor is larger than the largest diameter of the bushing of the magnetic module, wherein the applying, bending, flattening and positioning steps occur in a sequence that is optional provided that each applying of a sleeve takes place prior to the respective flattening of the end section to which that sleeve has been applied.

2. The method as claimed in claim 1, wherein the last flattening and the last bending take place after the positioning.

3. The method as claimed in claim 1, wherein at least one flattening comprises cold deformation of the sleeve of copper or copper alloy together with the end section of the conductor which is enclosed by the sleeve.

4. The method as claimed in claim 3, wherein the cold deformation comprises cold pressing.

5. The method as claimed in claim 1, wherein the middle section of the conductor is next to the magnetic module.

6. The method as claimed in claim 5, wherein the magnetic module comprises a Rogowski coil or a Hall element which is located next to the current conductor.

7. The method as claimed in claim 1, wherein the middle section of the conductor is located in a bushing of the magnetic module.

8. The method as claimed in claim 7, wherein the magnetic module comprises an unslotted annular core provided with a winding or a slotted annular core provided with a Hall element, wherein the conductor is routed through the annular core.

9. The method as claimed in claim 1, wherein the current conductor has a round cross section at least in the middle section.

10. The method as claimed in claim 1, wherein the bending is such that the current conductor is bent to an angle of roughly 90° between the middle section and at least one end section.

11. The method as claimed in claim 10, wherein the bending is such that a u-shaped conductor is fanned.

12. The method as claimed in claim 1, wherein the ends of the current conductor are cold-deformed before a flattening step.

13. The method as claimed in claim 1, wherein the applying one sleeve to the current conductor in at least one part of one end section and applying the other sleeve to the current conductor in at least one part of the other end section and/or the bending of the current conductor between the middle section and one end section and the bending the current conductor between the middle section and the other end section and/or the flattening of the current conductor on one end section provided with one sleeve and the flattening of the current conductor on the other end section provided with the other sleeve are done at the same time.

14. A method for producing a current metering device comprising:

a current conductor comprising a middle section having a shape of a bar and two end sections comprising flattened areas, and a magnetic module for measurement of a current flowing in the current conductor via a magnetic field produced by it, the method comprising:

providing a magnetic module, the current conductor comprising a middle section having a shape of a bar and two end sections, and two sleeves containing copper or a copper alloy and that fit onto at least parts of the end sections of the current conductor;

applying one sleeve to at least one part of one end section of the current conductor;

applying in the other sleeve to at least one art of the other section of the current conductor;

positioning the current conductor and the magnetic module relative to one another such that the middle section of the current conductor is located with respect to the magnetic module such that the magnetic module meters the magnetic field which forms when current is flowing through the current conductor;

bending the current conductor between the middle section and one end section, bending the current conductor between the middle section and the other end section, flattening the current conductor on one end section provided with one sleeve, and flattening the current conductor on the other end section provided with the other sleeve, wherein the applying, bending, flattening and positioning steps occur in a sequence that is optional provided that each applying of a sleeve takes place prior to the respective flattening of the end section to which that sleeve has been applied, and wherein the sleeves are heat-treated before application to the current conductor.

15. A method for producing a current metering device comprising:

a current conductor comprising a middle section having a shape of a bar and two end sections comprising flattened areas, and a magnetic module for measurement of a current flowing in the current conductor via a magnetic field produced by it, the method comprising:

providing a magnetic module, the current conductor comprising a middle section having a shape of a bar and two end sections, and two sleeves containing copper or a copper alloy and that fit onto at least parts of the end sections of the current conductor;

applying one sleeve to at least one part of one end section of the current conductor;

applying the other sleeve to at least one part of the other section of the current conductor;

positioning the current conductor and the magnetic module relative to one another such that the middle section of the current conductor is located with respect to the magnetic module such that the magnetic module meters the magnetic field which forms when current is flowing through the current conductor;

bending the current conductor between the middle section and one end section, bending the current conductor between the middle section and the other end section, flattening the current conductor on one end section provided with one sleeve, and flattening the current conductor on the other end section provided with the other sleeve, wherein the applying, bending, flattening and positioning steps occur in a sequence that is optional provided that each applying of a sleeve takes place prior to the respsective flattening of the end section to which that sleeve has been applied, and wherein the sleeves are tin-plated before the flattening.

16. The method as claimed in claim 1, wherein the current conductor comprises aluminum or an aluminum alloy.

* * * * *